United States Patent [19]
Pan

[11] Patent Number: 5,892,270
[45] Date of Patent: Apr. 6, 1999

[54] CHIP ON BOARD ASSEMBLY WITHOUT WIRE BONDING

[75] Inventor: Eric Ting-Shan Pan, Fremont, Calif.

[73] Assignee: Samsung Electronics Co., Ltd., Seoul, Rep. of Korea

[21] Appl. No.: 862,802

[22] Filed: May 23, 1997

[51] Int. Cl.⁶ .............................. H01L 23/50; H01L 23/48
[52] U.S. Cl. .................... 257/666; 257/676; 257/673; 257/672; 257/786; 29/827
[58] Field of Search ..................... 257/661, 673, 257/676, 672, 786, 737, 787, 734, 691, 738, 723, 698; 29/827

[56] References Cited

U.S. PATENT DOCUMENTS

| | | | |
|---|---|---|---|
| 4,028,722 | 6/1977 | Helda ........................................ | 257/672 |
| 5,212,402 | 5/1993 | Higgins, III .............................. | 257/672 |
| 5,424,577 | 6/1995 | Suzuki et al. ............................ | 257/672 |
| 5,530,282 | 6/1996 | Tsuji ......................................... | 257/666 |
| 5,661,336 | 8/1997 | Phelps, Jr. et al. ...................... | 257/668 |
| 5,677,567 | 10/1997 | Ma et al. .................................. | 257/666 |
| 5,693,565 | 12/1997 | Comilletti et al. .............................. | 1/1 |
| 5,726,490 | 3/1998 | Moroi ....................................... | 257/676 |

*Primary Examiner*—Alexander Oscar Williams
*Attorney, Agent, or Firm*—Townsend and Townsend and Crew LLP

[57] ABSTRACT

An apparatus and method of attaching I/O pads of an integrated circuit die to package leads. The attachment is made using conventional assembly processes but without using wire bonding. A leadframe with lead fingers is formed and the lead fingers are aligned with bumps extending from the I/O pads. A connection is made by physical contact, laser spot welding, or other coupling techniques.

24 Claims, 3 Drawing Sheets

CHIP ON BOARD ASSEMBLY WITHOUT WIRE BONDING

BACKGROUND OF THE INVENTION

This invention relates generally to integrated circuit packaging, and more specifically, to an improved integrated circuit package and method of attaching leads of the package to the I/O pads of an integrated circuit die. The attachments are made using conventional assembly processes, without using wire bonding.

As the speed and complexity of integrated circuits continue to increase, new and improved packaging techniques become necessary. Traditional packaging techniques are not always well suited for some applications. However, because of the high cost of purchasing capital equipment and new manufacturing technologies, it is desirable for a manufacturer to make such improvements without making major changes to the manufacturing process.

One aspect of packaging is the attachment of I/O pads of an integrated circuit die to the leads of the integrated circuit package. A traditional technique for making such an attachment is wire bonding. Wire bonding is a technique by which discrete wires are attached between the I/O pads and the leads. Though the technique is extensively used in the industry, wire bonding has several disadvantages. Among these disadvantages are the cost, the package size, and the heat sink properties of wirebonded packages. Another disadvantage is that the wire placed between an I/O pad and a package pin changes the characteristics of the device. For example, the wire adds inductance to the electrical path.

In some applications, this added inductance is not desirable. For example, the increased inductance will not allow the device to operate at the high switching speed of many of today's integrated circuits. The frequency at which the integrated circuits operate is continually increasing. In the past, the inductance of the wire was not an important factor. However, as speeds increase, it becomes more significant.

Because of these higher operating frequencies, the use of gallium arsenide integrated circuits is increasing in the industry. Gallium arsenide integrated circuits are now often found in many wireless communications, TVs, VCRs, and other similar electronics. Traditional silicon integrated circuits cannot match the high frequencies of gallium arsenide. Silicon reaches its operating peak at around 2.5 MHz. However, gallium arsenide integrated circuits can operate at frequencies approaching 30 GHZ. At such high speeds, traditional wirebonding, with its relatively high inductance, is not a practical packaging technique.

Another packaging technique that has been introduced is TAB (tape automated bonding.) However, TAB has not been well received in the industry. Several factors have contributed to its lack of success. For example, TAB requires its own specialized assembly equipment. This makes it expensive to switch to a TAB processing system. Furthermore, reliability problems are often associated with TAB packaging. For example, humidity may cause tape used in the TAB process to delaminate. Also, TAB technology does not provide any protection to the integrated circuit die during the manufacturing process because the integrated circuit die remains exposed throughout the process.

In light of these and other disadvantages associated with conventional techniques, there is a need for a new technology for packaging integrated circuits. An improved packaging technique is therefore desirable.

SUMMARY OF THE INVENTION

A semiconductor device is provided comprising an integrated circuit die having a plurality of I/O pads arranged in a pattern. A leadframe is provided with a plurality of lead fingers arranged in the same pattern as the I/O pads. The lead fingers of the leadframe are coupled with the I/O pads providing an electrical connection.

In a preferred embodiment, a contact post and a contact pad are fabricated on the I/O pads. The contact pads are placed in contact with the lead fingers. In a preferred embodiment the lead fingers are spot welded to the I/O pads.

A further understanding of the nature and advantages of the inventions herein may be realized by reference to the remaining portions of the specification and the attached drawings.

DESCRIPTION OF THE SPECIFIC EMBODIMENTS

Figure 1:
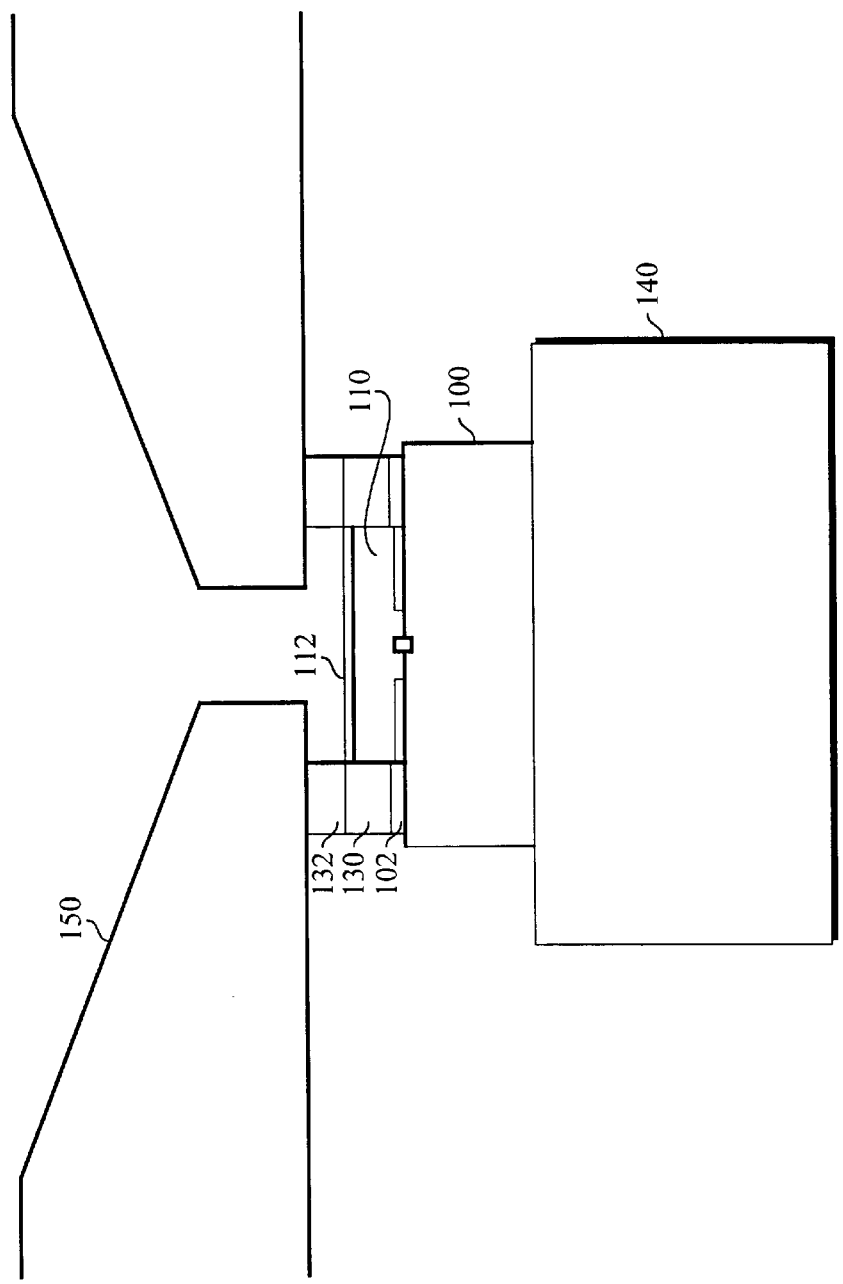
FIG. 1 is a cross section of an integrated circuit package of the present invention.

FIG. 1 illustrates a cross section of an integrated circuit package of the present invention. An integrated circuit die 100 is provided. Integrated circuit die 100 has one or more I/O pads 102 through which it can communicate with other devices. Integrated circuit die 100 may be fabricated using any integrated circuit technology. Such fabrication techniques are well known in the industry. In a preferred embodiment, integrated circuit die 100 may be fabricated using gallium arsenide. Alternatively, integrated circuit die 100 may be fabricated using silicon.

A contact post 130 may extend from each I/O pad 102. Contact post 130 may be fabricated by a bumping process such as those used in existing flip chip technology. Contact post 130 may be, for example, a bump of metal deposited onto I/O pad 102. The metal may be, for example, gold, chromium copper with gold plating, titanium tungsten with gold plating, titanium palladium with gold plating, or titanium platinum with gold plating. Other conductive materials may also be used to form contact post 130. The formation of such a contact post will be well known to one of skill in the art.

Integrated circuit die 100 may be further processed with a passivation layer 110 on the surface of integrated circuit die 100. This passivation layer 110 may be a dielectric material, for example, benzocyclobutene (BCB) polymer film or other conformal coatings. In a preferred embodiment, a second layer of passivation 112 may also be provided. Second level of passivation 112 may be, for example, SiN, SiO, or SiC. During this processing, holes are left in the passivation layers over I/O pads 102 so that they are not covered by first and second passivation layers 110 and 112.

A contact pad 132 may be fabricated on contact post 130. In a preferred embodiment, contact pad 132 may be larger than contact post 130. This provides a larger surface area to which contact may be made. Having a larger surface area is beneficial in obtaining a good connection to the lead fingers. Portions of contact pad 132 may extend over a portion of passivation layers 110 and 112. Contact pad 132 may be comprised of metals or other conductive materials. In an embodiment of the present invention, contact pad 132 comprises gold. In another embodiment of the present invention, contact pad 132 comprises titanium. The use of titanium may enhance the adhesion of contact pad 132 to second layer of passivation 112.

Figure 2:
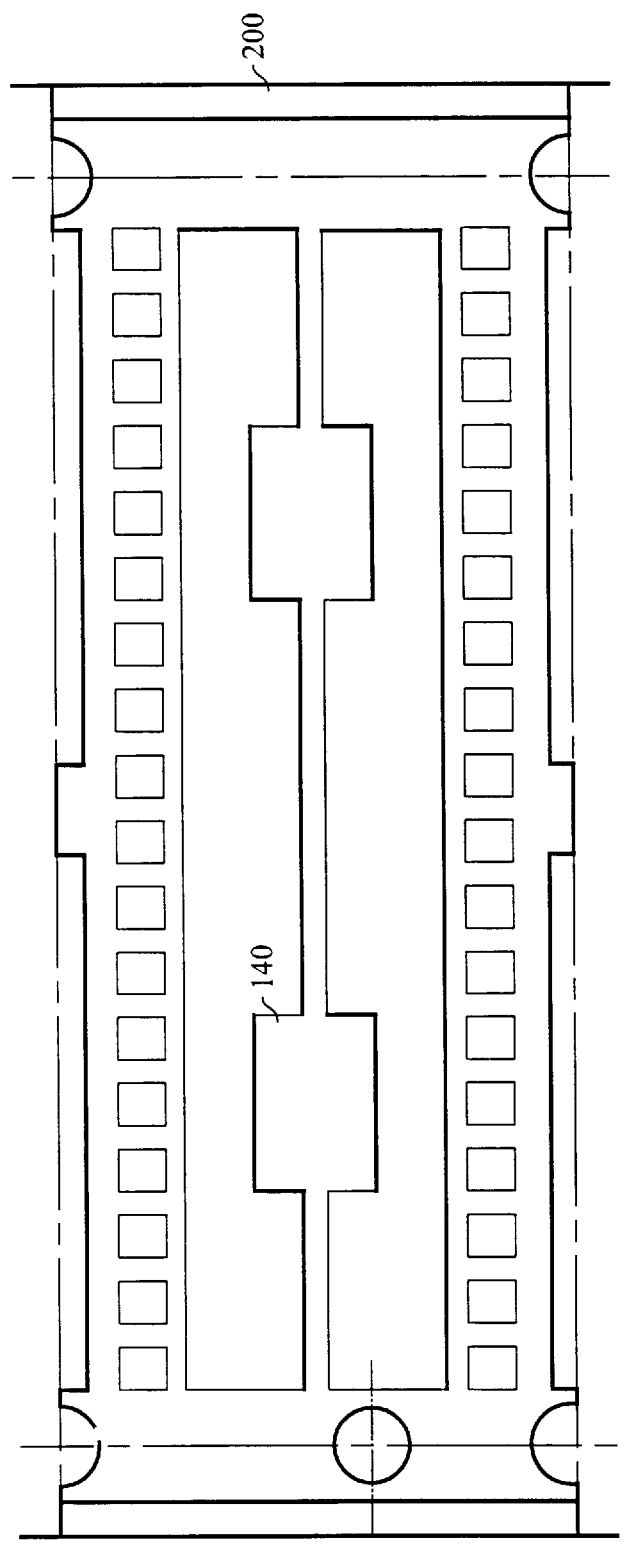
FIG. 2 depicts a die paddle leadframe.

On a side opposite I/O pads 102, integrated circuit die 100 may be attached to a die paddle 140. FIG. 2 is a more detailed diagram of die paddle 140. Die paddle 140 is formed in a die paddle leadframe 200. Die paddle leadframe 200 may be designated as a first leadframe. Die paddle 140 is the backbone of the plastic package. It adds support to integrated circuit die 100. Die paddle leadframe 200 has socket holes on opposing sides as shown in FIG. 2, which provide. vehicle for transporting the die through the manufacturing process. It may be fabricated, for example, from a strip of sheet metal. Die paddle 140 may be formed in the sheet metal of die paddle leadframe 200. Die paddle 140 may have approximately the same footprint as integrated circuit die 100. The integrated circuit die 100 may be attached to die paddle leadframe 200 using a conventional die attachment process offering high accuracy placement for semiconductor devices. This process is well known in the art.

Referring again to FIG. 1, the present invention also provides a plurality of lead fingers 150. Lead fingers 150 may provide an electrical contact to I/O pads 102 through contact pad 132 and contact post 130. They may be located on the side of integrated circuit die 100 that has I/O pads 102.

Figure 3:
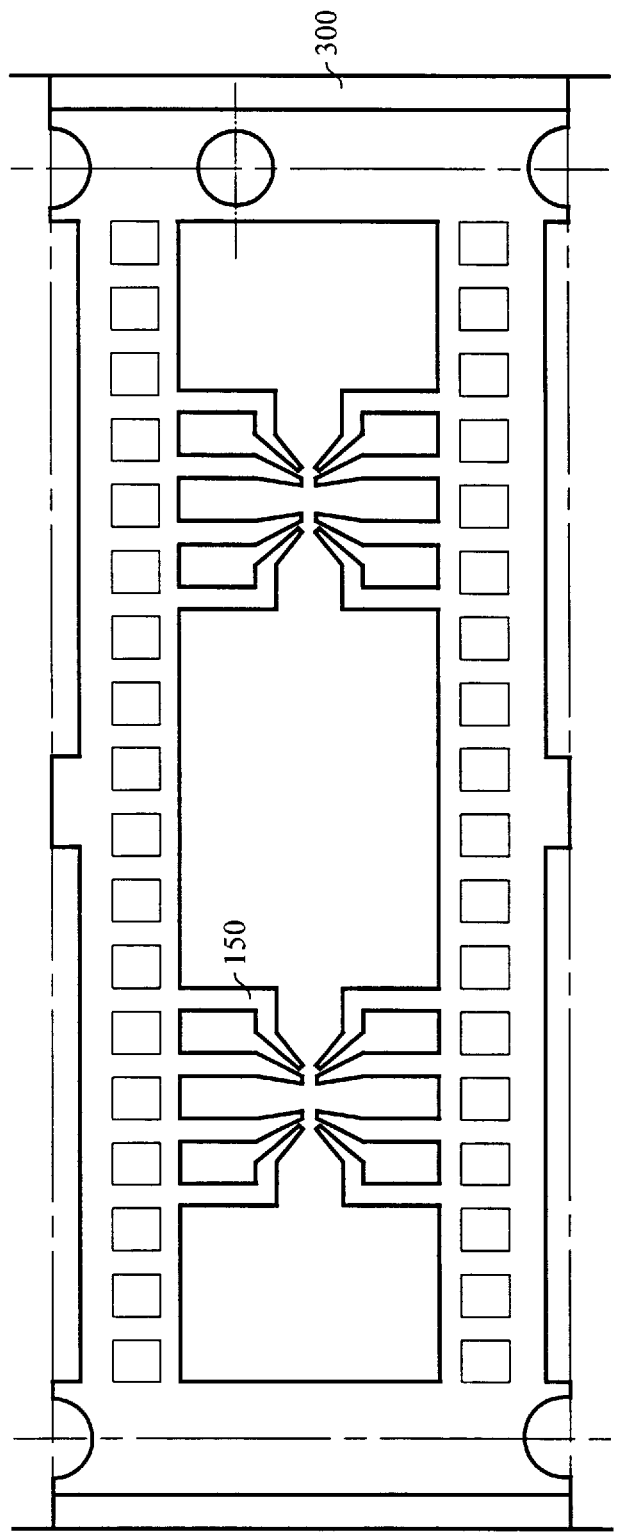
FIG. 3 depicts a leadframe with lead fingers.

FIG. 3 is a more detailed diagram of lead fingers 150. Lead fingers 150 are formed from a leadframe 300. Leadframe 300 may be designated as a second leadframe. Leadframe 300 has socket holes on opposing sides as shown in FIG. 3, which provide a vehicle for transporting the die through the manufacturing process. Lead fingers 150 extend from leadframe 300. They are formed such that contact points of lead fingers 150 are arranged in a pattern corresponding to the pattern of I/O pads 102 of integrated circuit die 100. In a preferred embodiment, the contact points are the tips of lead fingers 150.

Lead fingers 150 of leadframe 300 are aligned with the I/O pads 102 of integrated circuit die 100. The alignment Be may by accomplished by alignment marks in die paddle leadframe 200 or integrated circuit die 100. The contact points of lead fingers 150 may then be brought into contact with contact pads 132. In a preferred embodiment, lead fingers 300 may be laser spot welded to contact pads 132. Alternatively, the contact pads 132 and lead fingers 150 are simply brought into physical contact. Lead fingers 150 may include surface features such as particle interconnect or other microstructures to ensure stable contact. Other existing technology for providing a connection may also be used. For example, solder reflow may be used to provide the connection. For some applications, the laser spot welding step may be desirable to provide a more sure contact in harsh environments. However, other existing technologies for contacting the lead fingers 150 to the contact post 130 may also be used.

Integrated circuit die 100 and lead fingers 150 may be optionally encapsulated within a plastic mold. Such encapsulation provides protection to the device and helps to maintain the physical contact between contact pads 132 and lead fingers 150. Subsequent assembly processes such as deflash, marking, lead plating, lead trim, and lead form can be applied with conventional manufacturing tooling. One advantage of this invention is the use of conventional manufacturing technologies in its application.

Although the invention has been described with reference to the figures and specific embodiments described herein, the invention is not limited to this embodiment. Other embodiments that do not depart from the spirit and scope of the present invention, as defined by the attached claims, are also covered by this application. This specification is intended only as an example, and no limitations are intended nor implied herein.

What is claimed is:

1. A semiconductor device comprising:
    a designated first leadframe, said first leadframe comprising a first die paddle and a plurality of socket holes for transporting the first leadframe through a manufacturing process;
    an integrated circuit die located above the first leadframe, the integrated circuit die having a plurality of I/O pads arranged in a pattern;
    a designated second leadframe above the integrated circuit die comprising:
        a plurality of socket holes for transporting the second leadframe through the manufacturing process;
        a first plurality of lead fingers; and
        a plurality of contact points, each of said plurality of lead fingers having one of said plurality of contact points, wherein said lead fingers are configured such that said plurality of contact points are disposed in said pattern; and
    a plurality of contact posts, each of said plurality of contacts posts extending from said plurality of I/O pads, wherein said contact points are coupled to said I/O pads through said contact posts.

2. The semiconductor device of claim 1 wherein said plurality of contact posts are comprised of a gold plated metal.

3. The semiconductor device of claim 2 wherein said metal is one of the set consisting of gold, chromium copper with gold plating, titanium palladium with gold plating, titanium tungsten with gold plating, and titanium platinum with gold plating.

4. The semiconductor device of claim 1 wherein said integrated circuit die further comprises a first passivation layer on said integrated circuit die, said first passivation layer having openings wherein said contact posts are left uncovered by said passivation layer.

5. The semiconductor device of claim 4 wherein said first passivation layer is a benzocyclobutene (BCB) polymer film.

6. The semiconductor device of claim 4 further comprising a second passivation layer on said first passivation layer.

7. The semiconductor device of claim 6 wherein said second passivation layer comprises one of the set consisting of SiN, Sio, and SiC.

8. The semiconductor device of claim 1 further comprising a plurality of contact pads on said plurality of contact posts, said plurality of contact pads being comprised of a metal and contacting said plurality of lead fingers.

9. The semiconductor device of claim 8 wherein said metal is comprised of one of the set consisting of gold, and gold with titanium.

10. The semiconductor device of claim 8 wherein said contact pads are spot welded to said lead fingers.

11. The semiconductor device of claim 1 wherein said integrated circuit die and said lead fingers are encased in plastic.

12. A semiconductor device comprising:
    an integrated circuit die having a plurality of I/O pads arranged in a pattern;
    a plurality of contact posts, each of said plurality of contact posts extending from said plurality of I/O pads;
    a first passivation layer, said first passivation layer being on said integrated circuit die, said first passivation layer having a plurality of holes corresponding to said plurality of contact posts wherein said plurality of contact posts are not covered by said first passivation layer;

a second passivation layer on said first passivation layer, said second passivation layer having a plurality of holes corresponding to said plurality of contact posts wherein said plurality of contact posts are not covered by said second passivation layer;

a plurality of contact pads, each of said plurality of contact pads extending from one of said plurality of contact posts;

a designated second leadframe, said second leadframe having a plurality of lead fingers, said plurality of lead finger each having a contact point, said contact points being disposed in said pattern, said contact points being coupled with said plurality of contact pads; and a designated first leadframe, said first leadframe being attached to said integrated circuit die.

13. The semiconductor device of claim 12 wherein said plurality of contact posts are comprised of a gold plated metal.

14. The semiconductor device of claim 13 wherein said metal is one of the set consisting of gold, chromium copper with gold plating, titanium palladium with gold plating, titanium tungsten with gold plating, and titanium platinum with gold plating.

15. The semiconductor device of claim 12 wherein said first passivation layer is a benzocyclobutene (BCB) polymer film.

16. The semiconductor device of claim 12 wherein said second passivation layer is one of the set consisting of SiN, SiO, and SiC.

17. The semiconductor device of claim 12 wherein contact pads are comprised of a metal, said metal being in the set consisting of gold, and gold with titanium.

18. The semiconductor device of claim 12 wherein said contact pads are spot welded to said lead fingers.

19. The semiconductor device of claim 12 wherein said integrated circuit die and said lead fingers are encased in plastic.

20. The semiconductor device of claim 1 wherein the plurality of socket holes of the second leadframe are situated along opposing sides of the second leadframe.

21. The semiconductor device of claim 1 wherein the plurality of socket holes of the first leadframe are situated along opposing sides of the first leadframe.

22. The semiconductor device of claim 1 further comprising a second die paddle in the first leadframe.

23. The semiconductor device of claim 1 further comprising a second plurality of lead fingers in the second leadframe.

24. A leadframe for attaching to an integrated circuit die with a plurality of I/O pads arranged in a pattern, the leadframe comprising:

a metal frame having first and second opposing sides, wherein the metal on the first and second opposing sides defines a plurality of socket holes for transporting the leadframe through a manufacturing process; and a plurality of metal lead fingers extending inward from the first and second opposing sides of the metal frame, each of the plurality of metal lead fingers having a contact point, wherein said lead fingers are configured such that the contact points are disposed in the pattern.

* * * * *